(12) United States Patent
Chen et al.

(10) Patent No.: US 8,043,462 B2
(45) Date of Patent: Oct. 25, 2011

(54) METHODS FOR FORMING GAS BARRIERS ON ELECTRONIC DEVICES

(75) Inventors: Hui-Ta Chen, Taichung (TW); Chun-Hao Chang, Kaohsiung County (TW); Sung-Ho Liu, Kaohsiung (TW); Chun-Hao Tseng, Pingtung County (TW)

(73) Assignee: Industrial Technology Research Institute, Hsinchu (TW)

( * ) Notice: Subject to any disclaimer, the term of this patent is extended or adjusted under 35 U.S.C. 154(b) by 207 days.

(21) Appl. No.: 12/416,664

(22) Filed: Apr. 1, 2009

(65) Prior Publication Data
US 2010/0112889 A1 May 6, 2010

(30) Foreign Application Priority Data
Oct. 31, 2008 (TW) ................................. 97142036 A (51) Int. Cl.
| B29C 65/16 | (2006.01) |
| B29C 65/48 | (2006.01) |
| B32B 37/14 | (2006.01) |
| B32B 38/10 | (2006.01) |
| H01L 21/027 | (2006.01) |
| B29C 65/54 | (2006.01) |
| B32B 37/06 | (2006.01) |

(52) U.S. Cl. .............. 156/275.7; 156/272.8; 156/275.5; 156/289; 156/297; 156/300; 438/22; 438/66

(58) Field of Classification Search .... 156/272.2–275.5, 156/289, 297, 300; 438/22–32, 66, 643, 438/653

See application file for complete search history.

(56) References Cited

U.S. PATENT DOCUMENTS
| 4,970,196 | A | 11/1990 | Kim et al. |
| 5,173,441 | A | 12/1992 | Yu et al. |
| 6,673,426 | B1 * | 1/2004 | Furukawa et al. ............ 428/213 |
| 6,998,776 | B2 | 2/2006 | Aitken et al. |
| 7,083,739 | B2 * | 8/2006 | Furukawa et al. ............... 216/33 |
| 7,198,832 | B2 | 4/2007 | Burrows et al. |
| 7,229,900 | B2 * | 6/2007 | Takayama et al. ............ 438/458 |
| 7,704,777 | B2 * | 4/2010 | Kamine .......................... 438/66 |
| 2005/0238846 | A1 * | 10/2005 | Arakatsu et al. .............. 428/141 |
| 2006/0028128 | A1 * | 2/2006 | Ohkubo ......................... 313/506 |
| 2008/0182385 | A1 * | 7/2008 | Kamine ......................... 438/458 |

FOREIGN PATENT DOCUMENTS
| DE | 102007040655 A1 * | 3/2009 |
| JP | 2005347275 A  * | 12/2005 |

OTHER PUBLICATIONS

English Translation of DE102007040655—Doelle et al. Mar. 2009.*
English translation of DE 102007040655 A1; Vissing et al.—Mar. 12, 2009.*
English abstract of JP 2005347275 A; Jeong et al.—Dec. 15, 2005.*

* cited by examiner

*Primary Examiner* — Sonya Mazumdar (57) ABSTRACT

A method for forming gas barriers on electronic devices is provided. The fabrication method includes: providing a first substrate having at least one electronic device thereon; providing a second substrate and forming a gas barrier over the second substrate; disposing the second substrate over the first substrate, wherein the gas barrier faces the electronic device; providing an electromagnetic wave light source over the second substrate; and irradiating the second substrate by the electromagnetic wave light source to transfer the gas barrier to the electronic device and cover the electronic device.

25 Claims, 9 Drawing Sheets

METHODS FOR FORMING GAS BARRIERS ON ELECTRONIC DEVICES

CROSS REFERENCE TO RELATED APPLICATIONS

This Application claims priority of Taiwan Patent Application No. 97142036, filed on Oct. 31, 2008, the entirety of which is incorporated by reference herein.

BACKGROUND OF THE INVENTION

1. Field of the Invention

The invention relates to an electronic device and more particularly to a method for forming a gas barrier on the electronic device.

2. Description of the Related Art

Organic light emitting diodes (OLED) have advantages of self-lighting emittance, quick response and high display quality. Thus, OLEDs are one kind of organic electronic device that is widely applied in organic light emitting displays. However, OLEDs are easy permeated by water vapor and oxygen, so that the efficiency and lifespan thereof are reduced. Therefore, OLEDs need to be sealed.

For conventional organic light emitting displays, the OLEDs are packaged by metal or glass. For example, U.S. Pat. No. 6,998,776 discloses using a glass plate as a package covering and using a gastight melting material to seal the OLEDs, wherein laser or infrared rays pass through the glass plate to process the gastight melting material. However, this kind of packaging material is not suitable for flexible displays. In addition, U.S. Pat. No. 7,198,832 discloses using a multi-layer structure to form a gas barrier. A film is coated on OLEDs by deposition to form the gas barrier and package the organic light emitting diodes. However, this kind of package needs several steps for its coating process, such that the fabrication thereof is time-consuming and the cost of the multi-layer structure is high.

Moreover, because the packaging methods of the conventional organic light emitting displays are performed by directly forming the gas barriers on the OLEDs and the OLEDs can only withstand a process temperature of smaller than 80° C., the process temperature of the gas barrier is limited and the water vapor and oxygen gas anti-permeation ability can not be enhanced.

Therefore, a method for forming gas barriers of electronic devices is desired, which is not limited by the acceptable process temperature of the electronic devices and the properties of the gas barriers can be improved.

BRIEF SUMMARY OF THE INVENTION

The invention provides a method for forming a gas barrier on an electronic device. First, a first substrate is provided, having at least one electronic device thereon. A second substrate is then provided and the gas barrier is formed on the second substrate. The second substrate is disposed over the first substrate, so that the gas barrier faces the electronic device. An electromagnetic wave light source is provided over the second substrate to irradiate the second substrate. Then, the gas barrier is transferred to the electronic device, covering the electronic device.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. The description is provided for illustrating the general principles of the invention and is not meant to be limiting. The scope of the invention is best determined by reference to the appended claims.

The invention is performed by forming a gas barrier on a substrate and then transferring the gas barrier to an electronic device. Therefore, the fabrication of the gas barrier on the electronic device is not limited by the acceptable process temperature of the electronic device. The gas barrier of the inventions can be fabricated by a higher process temperature.

Figure 1:
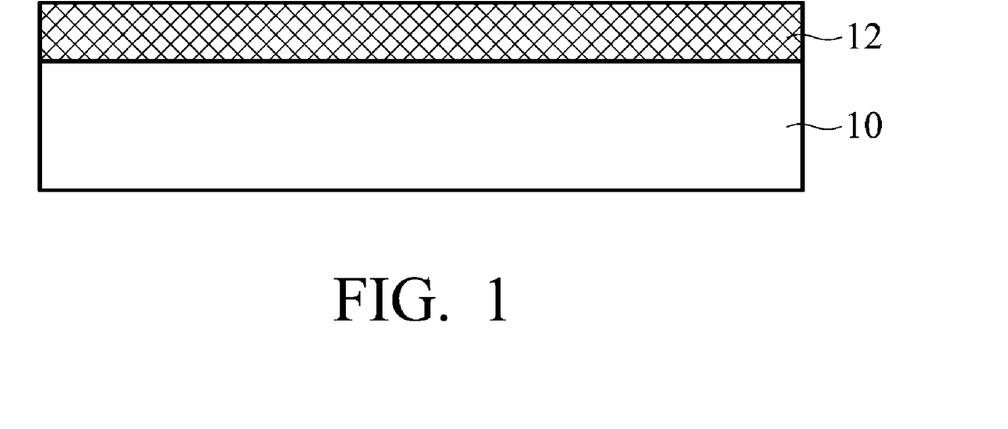
FIG. 1 is a schematic cross section of a material for forming and transferring a gas barrier according to one embodiment of the invention.

In one embodiment of the invention, a cross section of a structure of a material for forming and transferring the gas barrier is shown as FIG. 1. A gas barrier 12 is formed on a substrate 10. The substrate 10 may be a glass substrate, a flexible substrate or a substrate formed from other materials. The glass substrate has a heat-resistant temperature of about 900 to 1000° C. The flexible substrate has a heat-resistant temperature of about 200° C. The gas barrier 12 is a thin film with high transparency and high water vapor and oxygen gas anti-permeation ability. The material of the gas barrier 12 comprise silicon nitride (SiNx), silicon oxide (SiOx), metal nitride, metal oxide ($Al_2O_3$), diamond-like carbon (DLC), diamond-like compound or the combinations thereof. The gas barrier 12 may be a one layered or multi-layered thin film, and a plurality of particles may be dispersed in the gas barrier to form a complex thin film. In one embodiment, the gas barrier 12 can be formed on the substrate 10 by a plasma enhanced chemical vapor deposition (PECVD) process. The process temperature of the PECVD process is only limited by the heat-resistant temperature of the substrate 10. Therefore, the process temperature for forming the gas barrier 12 can be about a room temperature to about 1000° C. Because the heat-resistant temperature of the substrate 10 is higher than the acceptable process temperature of the electronic device, the gas barrier of the invention can be fabricated at a temperature higher than the acceptable process temperature of the electronic device. For example, the gas barrier is fabricated at a temperature higher than 80° C., and the water vapor and oxygen gas anti-permeation ability of a one-layered gas barrier formed at the temperature can be enhanced to above $5*10^{-3}$ g/m²/day. However, the conventional gas barrier needs to be fabricated at a temperature smaller than 80° C., and the water vapor and oxygen gas anti-permeation ability of the conventional one-layered organic/inorganic stacked gas barrier is only below about $1*10^{-2}$ g/m²/day. Additionally, the mechanical stress of the gas barrier of the invention is lower than conventional gas barriers. Moreover, the gas barrier of the invention can be applied to a flexible organic electronic device, as it is not easily broken when flexed.

Figure 2:
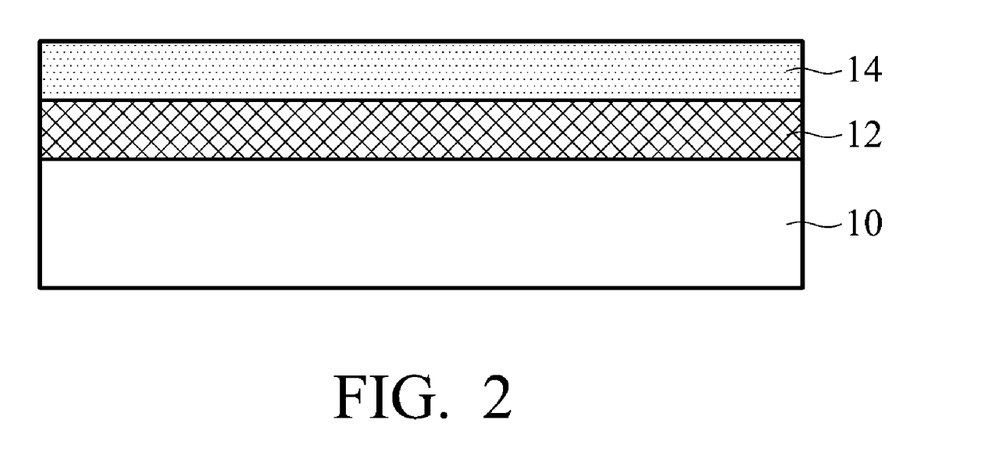
FIG. 2 is a schematic cross section of a material for forming and transferring a gas barrier according to another embodiment of the invention.

In another embodiment of the invention, a cross section of a structure of a material for forming and transferring the gas barrier is shown as FIG. 2. The gas barrier 12 is formed on the substrate 10 and an adhesive layer 14 is formed on the gas barrier 12. The material of the adhesive layer 14 is a transparent and adhesive material, such as epoxy resin or UV curing glue. The adhesive layer 14 can enhance the adhesion between the gas barrier and the substrate, and between the gas barrier and the electronic device. In one embodiment, the adhesive layer 14 can be formed on the gas barrier 12 by a spin coating process or dispensing.

Figure 3:
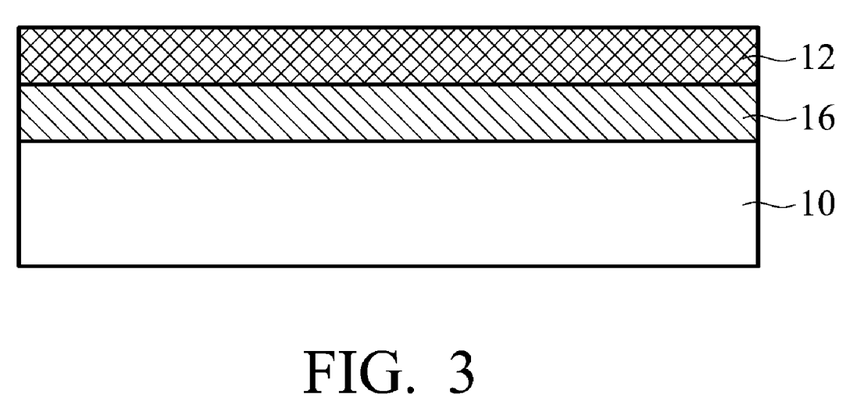
FIG. 3 is a schematic cross section of a material for forming and transferring a gas barrier according to further another embodiment of the invention.

In further another embodiment of the invention, a cross section of a structure of a material for forming and transferring the gas barrier is shown as FIG. 3. The difference between the embodiment of FIG. 3 and the above embodiments is that a stripping layer 16 is formed on the substrate 10 first, and then the gas barrier 12 is formed on the stripping layer 16. The stripping layer 16 may be an energy transfer layer, a laser etching layer or a laser separating layer. The stripping layer 16 can help to transfer the gas barrier 12. The material of the stripping layer 16 may be a S1818 positive typed photoresist (product of MicroChem company), a SU-8 negative typed photoresist (product of MicroChem company), polydimethysiloxane (PDMS), or benzoyl peroxide (BPO), or combinations thereof with carbon nano-tubes (CNT). In one embodiment, the stripping layer 16 can be formed on the substrate 10 by a spin coating process.

Figure 4:
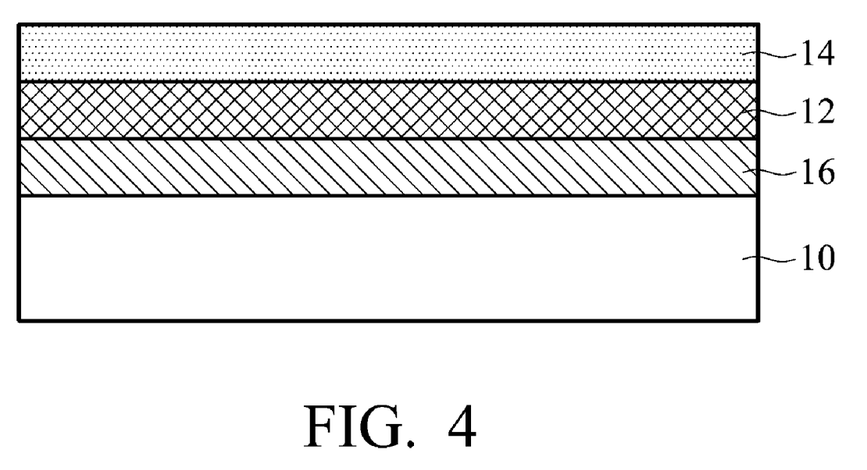
FIG. 4 is a schematic cross section of a material for forming and transferring a gas barrier according to further another embodiment of the invention.

In further one embodiment of the invention, a cross section of a structure of a material for forming and transferring the gas barrier is shown as FIG. 4. The stripping layer 16 is formed on the substrate 10 first, and then the gas barrier 12 is formed on the stripping layer 16. Next, the adhesive layer 14 is formed on the gas barrier 12. In this embodiment, the materials and the forming methods of the substrate 10, the stripping layer 16, the gas barrier 12 and the adhesive layer 14 are mainly the same as the above embodiments.

Figure 5A:
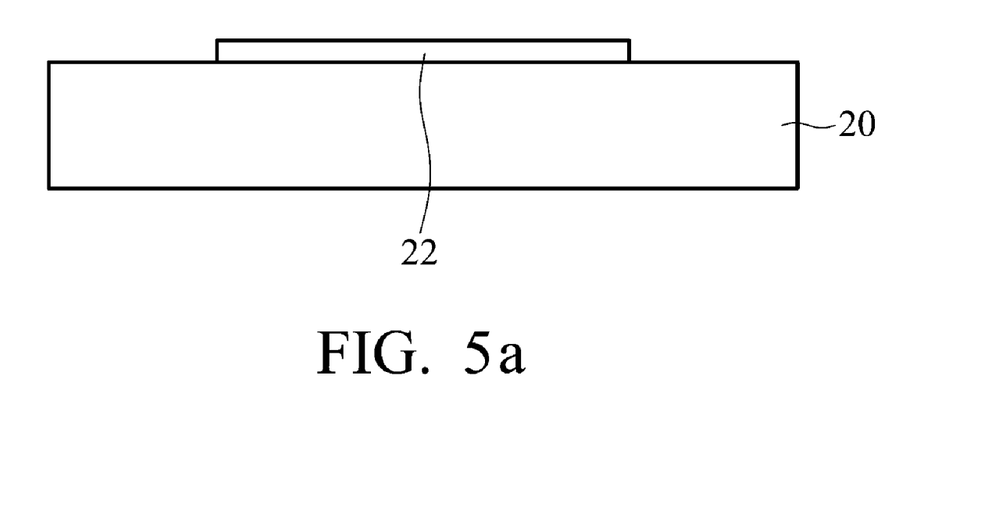
FIGS. 5a-5d are schematic cross sections of fabricating processes for forming and transferring a gas barrier to an electronic device according to one embodiment of the invention.
Figure 5B:
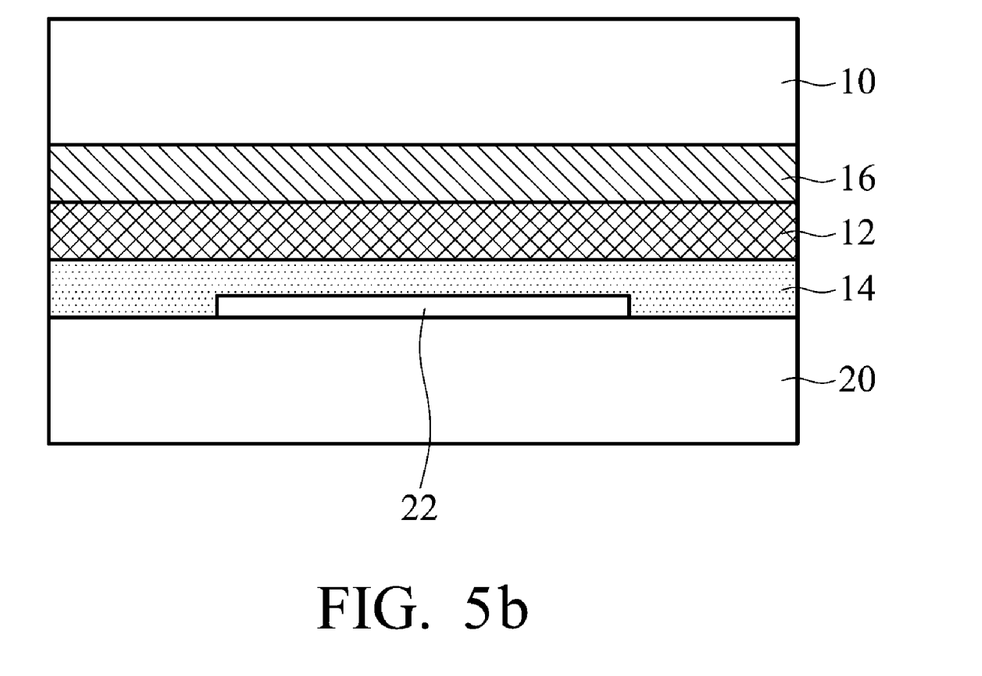

Referring to FIGS. 5a to 5d, which illustrate cross sections of fabricating processes for forming and transferring a gas barrier to an electronic device according to the embodiment of the material for forming and transferring the gas barrier as shown in FIG. 4. Referring to FIG. 5a, a substrate 20 is provided. At least one electronic device 22 is disposed on the substrate 20. The substrate 20 may be a plastic substrate or a flexible substrate formed from other materials. The electronic device 22 comprise an organic light emitting diode (OLED), an organic thin film transistor (OTFT) or an organic thin film solar cell. Next, referring to FIG. 5b, the material for forming and transferring the gas barrier as shown in FIG. 4 is attached to or disposed apart from over the substrate 20, such that the gas barrier 12 faces the electronic device 22. If the material for forming and transferring the gas barrier is attached to the substrate 20, the adhesive layer 14 is adhered to the substrate 20 and the electronic device 22.

Figure 5C:
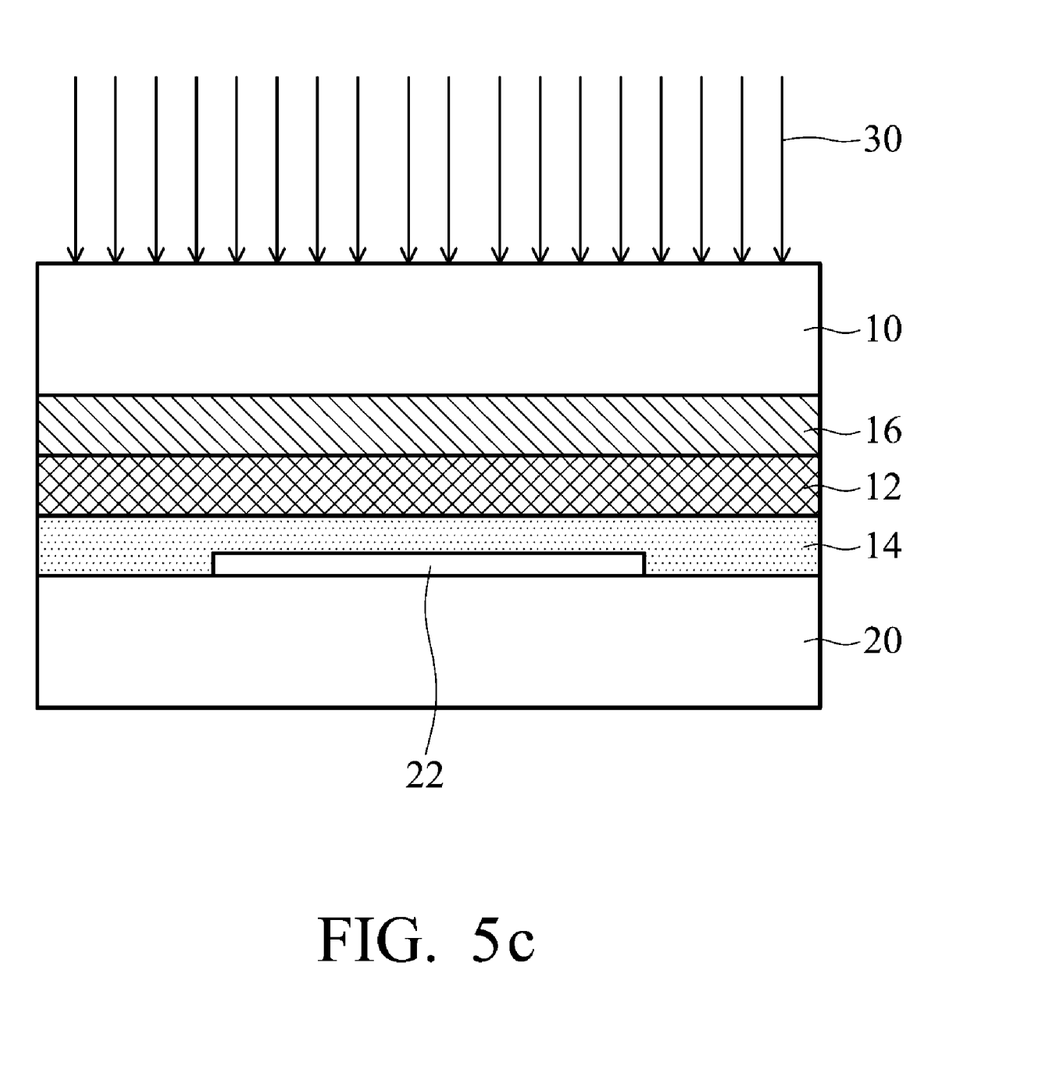

Referring to FIG. 5c, an electromagnetic wave light source 30 is disposed over the substrate 10. The electromagnetic wave light source 30 may be a full-wave band laser, an ultraviolet wave band laser or an infrared wave band laser. The laser light source 30 is used to irradiate the substrate 10 and make the laser light source 30 in focus or out of focus to the stripping layer 16 on the substrate 10 for scanning. In one embodiment, the stripping layer 16 absorbs 80 to 90% of the laser light energy. The ratio of the laser light energy absorbed by the stripping layer 16 is determined by the materials of the stripping layer. Then, the light energy absorbed by the stripping layer 16 is changed into a heat energy, such that the gas barrier 12 and the adhesive layer 14 are separated from the stripping layer 16 and transferred to the substrate 20 and the electronic device 22 together, covering the electronic device 22. The result is shown as FIG. 5d. In the steps of stripping and transferring, because the gas barrier 12 is a transparent material, the residual laser energy of about 0 to 10% of laser light energy, resulted from passing through the stripping layer 16 and the gas barrier 12, may be absorbed by the adhesive layer 14 and cure the material of the adhesive layer 14 by a photo curing reaction. As a result, the electronic device 22 is not damaged by the residual laser energy. Meanwhile, the adhesive layer 14 can enhance adhesion between the gas barrier 12 and the substrate 20 and between the gas barrier 12 and the electronic device 22.

Referring to FIG. 5d again, after the laser transferring process, a portion 12a of the gas barrier 12 and a portion 14a of the adhesive layer 14 irradiated by the laser light source 30 are transferred to the substrate 20 and the electronic device 22. A portion 12b of the gas barrier 12 and a portion 14b of the adhesive layer 14 not irradiated by the laser light source 30 are left on the substrate 10. In addition, a portion of the stripping layer 16 irradiated by the laser light source 30 may be left on the substrate 10, dispersed by gasification or stripped together to attach onto the portion 12a of the gas barrier 12.

Figure 5D:
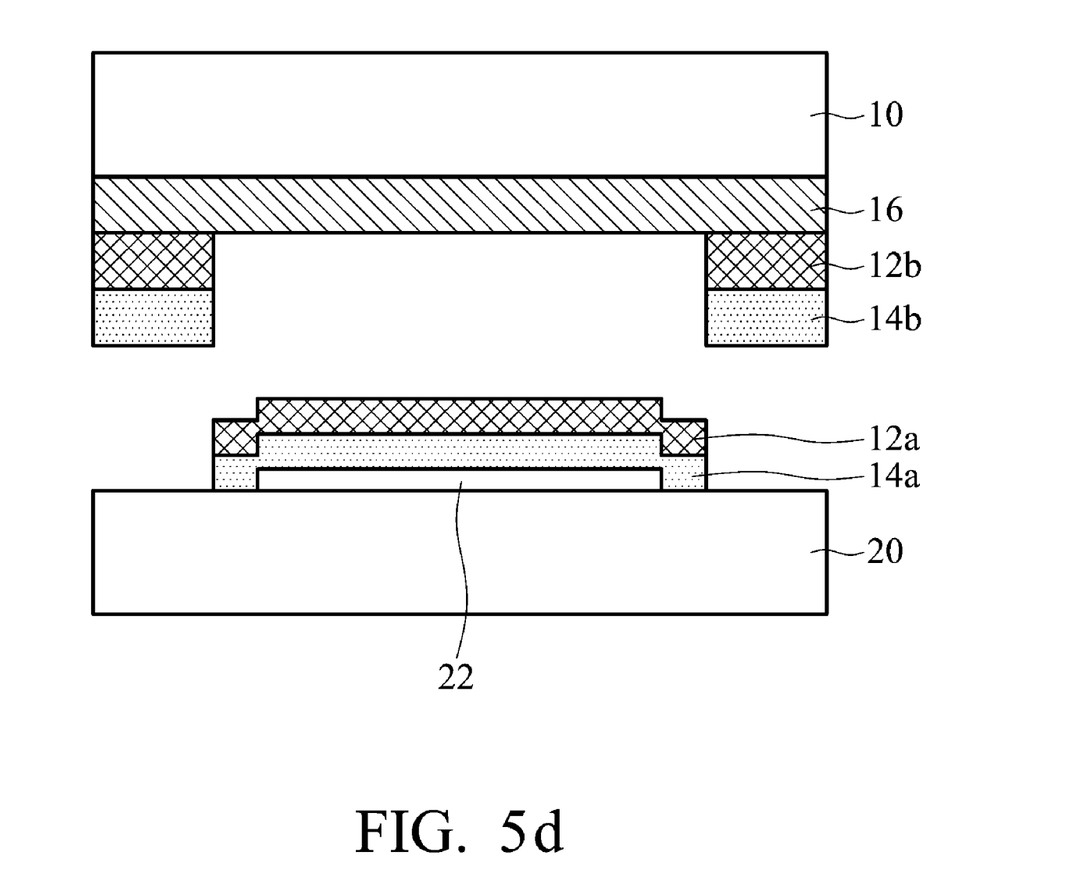

Note that in order to avoid incomplete photo curing reaction of the adhesive layer 14, after the gas barrier 12a and the adhesive layer 14a are transferred to the electronic device 22, an ultraviolet light source (not shown) may be further applied to completely cure and attach the adhesive layer 14 by irradiation.

In the process of forming and transferring the gas barrier 12, suitable laser wavelengths for different materials of the stripping layer 16, the gas barrier 12 and the adhesive layer 14 are needed to be determined. Additionally, the energy distribution of the laser will affect the transfer printing quality of the materials. Therefore, a laser uniformed module for uniform laser energy distribution is needed to improve the quality and the yield of the material transfer printing. For example, if the material of the stripping layer is the S1818 positive typed photoresist or the S1818 positive typed photoresist combined with the carbon nano-tubes, the material of the gas barrier is diamond-like carbon, and the material of the adhesive layer is epoxy resin, an ultraviolet laser with a wavelength of 355 nm, or an infrared laser with a wavelength of 1064 nm can be used. The laser energy of the ultraviolet laser or the infrared laser is about 0.5 to 2 W.

Figure 6:
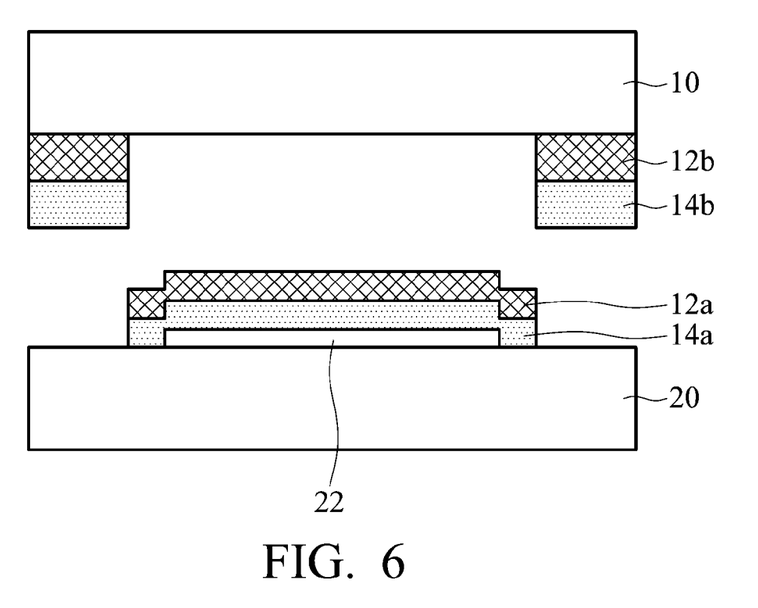
FIG. 6 is a schematic cross section of a structure of forming and transferring a gas barrier on an electronic device according to another embodiment of the invention.

In another embodiment of the invention, the material for forming and transferring the gas barrier as shown in FIG. 2 is used. The gas barrier is formed and transferred to the electronic device and the result is shown in FIG. 6. The fabricating processes for FIG. 6 are mainly the same as the embodiment shown in FIGS. 5a to 5d. The difference between the fabricating processes for FIG. 6 and FIG. 5d is that there is no stripping layer on the substrate 10 in the embodiment of FIG. 6. The laser light energy is focused on the gas barrier 12. A bombarded pressure produced from irradiating the gas barrier 12 by a laser, i.e., the gas barrier 12 directly receives photo pressure produced from bombarding photons combined with the molecular bonding broken by laser energy or explosions produced by laser energy, can make the gas barrier 12a and the adhesive layer 14a separate from the substrate 10 and transfer to the electronic device 22 and the substrate 20 together, covering the electronic device 22. Meanwhile, the gas barrier 12b and the adhesive layer 14b not irradiated by the laser are left on the substrate 10.

Figure 7:
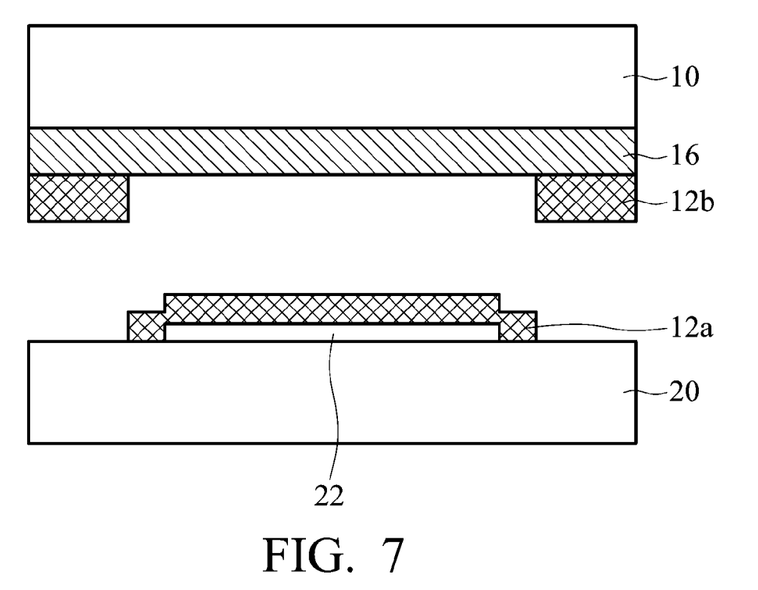
FIG. 7 is a schematic cross section of a structure of forming and transferring a gas barrier on an electronic device according to further another embodiment of the invention.

In another embodiment of the invention, the material for forming and transferring the gas barrier as shown in FIG. 3 is used. The gas barrier is formed and transferred to the electronic device and the result is shown in FIG. 7. The fabricating processes for FIG. 7 are mainly the same as the embodiment shown in FIGS. 5a to 5d. The difference between the fabricating processes for FIG. 7 and FIG. 5d is that there is no adhesive layer on the gas barrier 12 in the embodiment of FIG. 7. Only the gas barrier 12a is transferred to the electronic device 22 and the substrate 20. The gas barrier 12a directly covers the electronic device 22.

Figure 8:
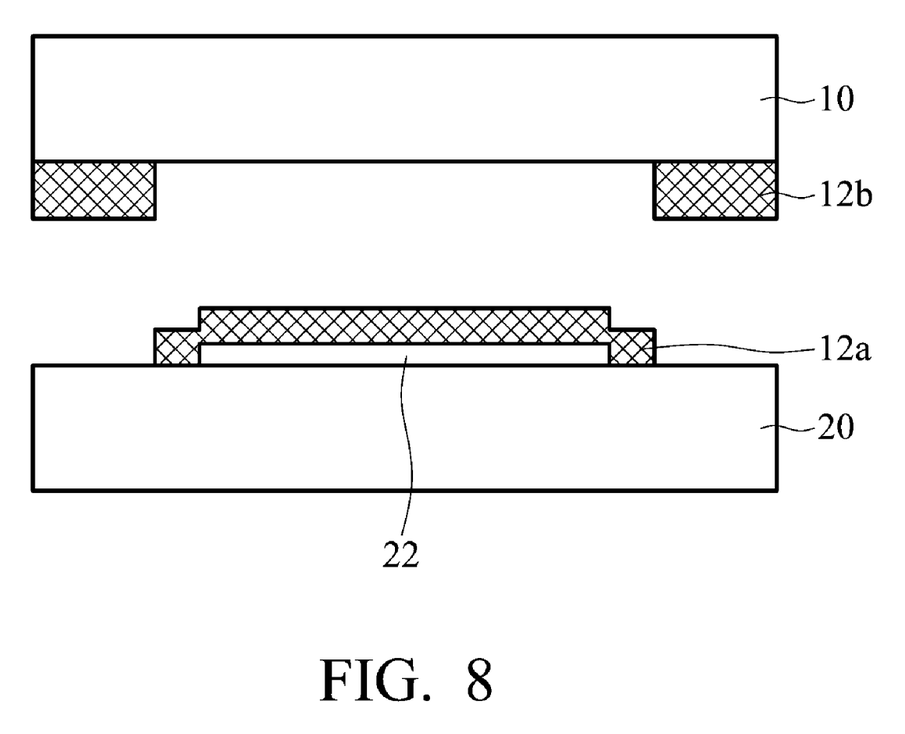
FIG. 8 is a schematic cross section of a structure of forming and transferring a gas barrier on an electronic device according to further another embodiment of the invention.

In further another embodiment of the invention, the material for forming and transferring the gas barrier as shown in FIG. 1 is used. The gas barrier is formed and transferred to the electronic device and the result is shown in FIG. 8. The fabricating processes for FIG. 8 are mainly the same as the embodiment shown in FIGS. 5a to 5d. The difference between the fabricating processes for FIG. 8 and FIG. 5d is that there are no stripping layer on the substrate 10 and no adhesive layer on the gas barrier 12 in the embodiment of FIG. 8. The laser light energy is focused on the gas barrier 12, such that the gas barrier 12a is formed and transferred to the electronic device 22 and the substrate 20.

Figure 9A:
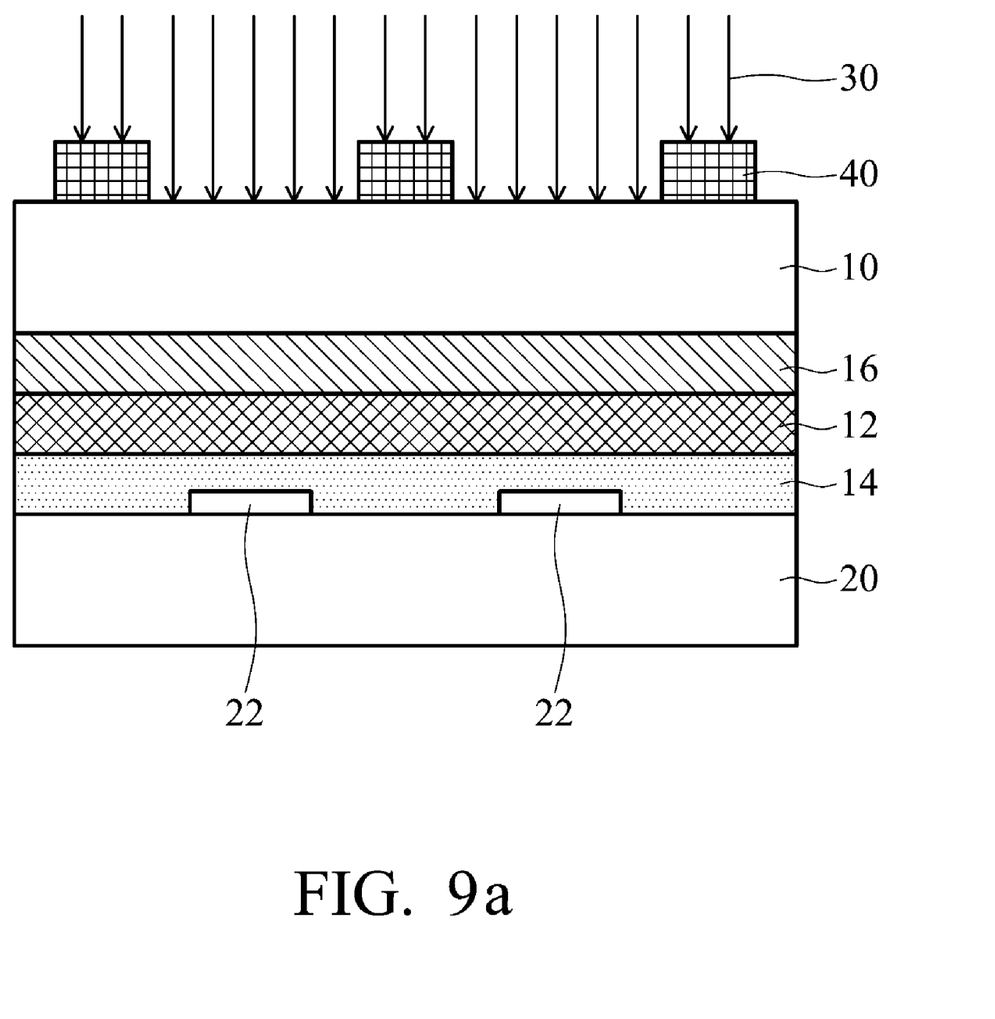
FIGS. 9a-9b are schematic cross sections of fabricating processes for forming and transferring a patterned gas barrier to a plurality of electronic devices according to one embodiment of the invention.
Figure 9B:
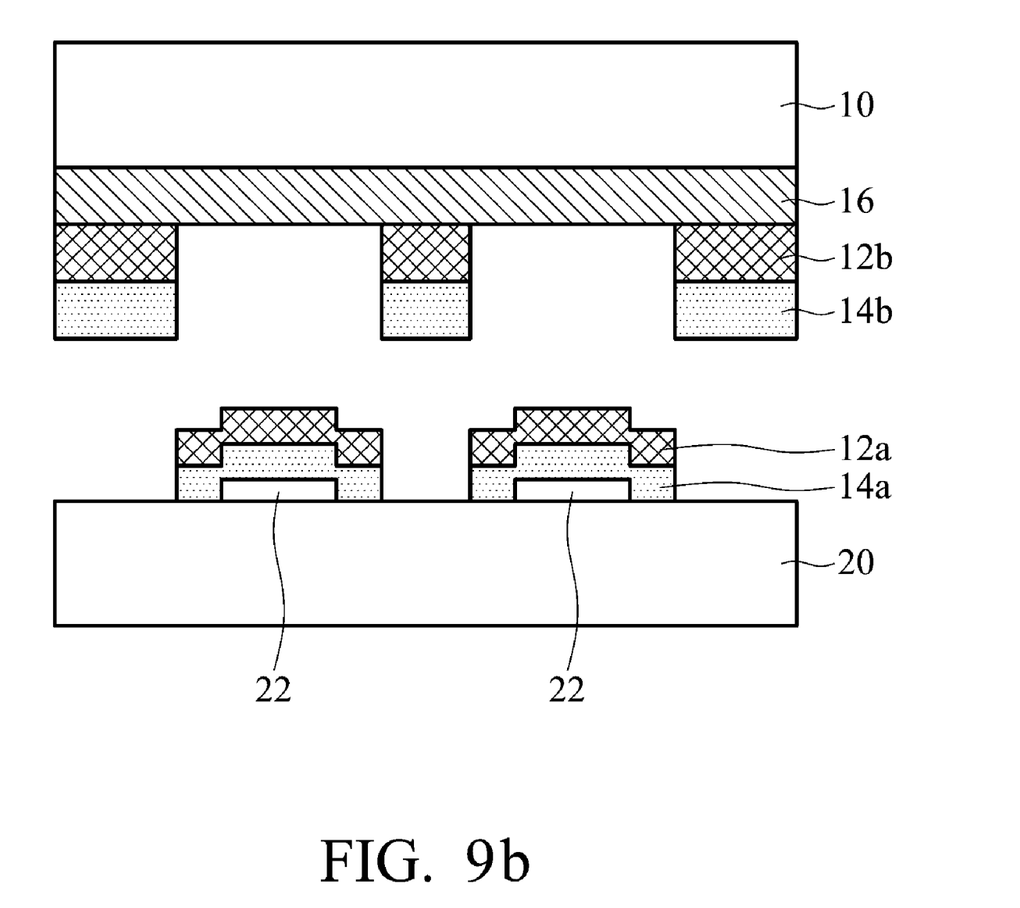

In addition, in another embodiment of the invention, a patterned gas barrier can be formed to cover a plurality of electronic devices on the substrate 20. Referring to FIGS. 9a to 9b, which illustrate cross sections of fabricating processes for forming and transferring a patterned gas barrier to the plurality of electronic devices according to the embodiment of the material for forming and transferring the gas barrier as shown in FIG. 4. Referring to FIG. 9a, a substrate 20 having two electronic devices 22 thereon is provided. Although there are only two electronic devices 22 shown in FIG. 9a, one skilled in the art should understand that there may be more than two electronic devices 22 on the substrate 20. In FIG. 9a, the material for forming and transferring the gas barrier is attached on the substrate 20, wherein the gas barrier 12 faces the electronic devices 22 and the adhesive layer 14 is adhered to the substrate 20 and the electronic devices 22. The difference between this embodiment and the above embodiments is that a mask 40 is disposed between the substrate 10 and the laser light source 30. The mask 40 may be a one layered or multi layered mask. The opening pattern on the mask 40 correspond to the plurality of electronic devices 22 on the substrate 20. Therefore, the laser light source 30 passing through the openings of the mask 40 can make the gas barrier 12 and the adhesive layer 14 transfer to the substrate 20 and the electronic devices 22 together. Meanwhile, the laser light source 30 shielded by the mask 40 can prevent the gas barrier 12 and the adhesive layer 14 transferring to the substrate 20. The result after the laser transferring process is shown in FIG. 9b, wherein a patterned gas barrier 12a and a patterned adhesive layer 14a are formed on the substrate 20 to cover each of the plurality of electronic devices 22. The gas barrier 12b and the adhesive layer 14b covered by the mask 40 are left on the stripping layer 16 on the substrate 10. Although this embodiment is illustrated according to the embodiment of the material for forming and transferring the gas barrier of FIG. 4, one skilled in the art should understand that the embodiments of the material for forming and transferring the gas barrier of FIGS. 1 to 3 also can be used and the mask 40 can be used in FIGS. 1 to 3 to form the patterned gas barrier 12a to cover each of the plurality of electronic devices 22.

The invention is performed by fabricating the gas barrier on a carrier substrate first, and then using laser transfer printing technology to transfer the gas barrier on the electronic devices. Therefore, consideration of the acceptable process temperature of the electronic devices during fabrication is not needed. A gas barrier with a high water vapor and oxygen gas anti-permeation ability and a low mechanical stress can be fabricated by a high temperature deposition process. In addition, the fabrication processes of transfer printing the gas barrier by a laser can be performed under room temperature, such that damage to the electronic devices thereof is minimized.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a gas barrier on an electronic device, comprising:
   providing a first substrate, having at least one electronic device thereon;
   providing a second substrate and forming the gas barrier on the second substrate;
   disposing the second substrate over the first substrate, wherein the gas barrier faces the electronic device;
   providing an electromagnetic wave light source over the second substrate; and
   using the electromagnetic wave light source to irradiate the second substrate, such that the gas barrier is transferred to the electronic device, covering the electronic device.

2. The method as claimed in claim 1, wherein the gas barrier comprises one or more than one layer of a thin film, and the thin film is a transparent, water resistant and gas barrier thin film.

3. The method as claimed in claim 1, wherein the material of the gas barrier comprises silicon nitride, silicon oxide, metal nitride, metal oxide, diamond-like carbon, diamond-like compound or combinations thereof.

4. The method as claimed in claim 1, wherein the gas barrier comprises a plurality of particles dispersed therein to form a complex thin film.

5. The method as claimed in claim 1, wherein the electromagnetic wave light source comprises a full-wave band laser, an ultraviolet wave band laser or an infrared wave band laser.

6. The method as claimed in claim 1, wherein the electromagnetic wave light source focuses in or out on the gas barrier.

7. The method as claimed in claim 1, further comprising forming a stripping layer between the second substrate and the gas barrier.

8. The method as claimed in claim 7, wherein the stripping layer comprises an energy transfer layer, a laser etching layer or a laser separating layer.

9. The method as claimed in claim 7, wherein the electromagnetic wave light source is in or out of focus on the stripping layer.

10. The method as claimed in claim 9, wherein the stripping layer absorbs a portion of the light energy of the electromagnetic wave light source and transfers the light energy into the gas barrier, so that the gas barrier is separated from the stripping layer.

11. The method as claimed in claim 7, further comprising forming an adhesive layer on the gas barrier of the second substrate.

12. The method as claimed in claim 11, wherein the adhesive layer and the gas barrier are transferred on the electronic device together, and the adhesive layer is disposed between the gas barrier and the electronic device.

13. The method as claimed in claim 11, wherein the adhesive layer is transparent and cured by absorbing a portion of the light energy of the electromagnetic wave light source.

14. The method as claimed in claim 12, wherein after the step of transferring the adhesive layer and the gas barrier on the electronic device together, further comprising applying an ultraviolet light source to the adhesive layer.

15. The method as claimed in claim 1, further comprising forming an adhesive layer on the gas barrier of the second substrate.

16. The method as claimed in claim 15, wherein the adhesive layer and the gas barrier are transferred on the electronic device together, and the adhesive layer is disposed between the gas barrier and the electronic device.

17. The method as claimed in claim 15, wherein the adhesive layer is transparent and cured by absorbing a portion of the light energy of the electromagnetic wave light source.

18. The method as claimed in claim 16, wherein after the step of transferring the adhesive layer and the gas barrier on the electronic device together, further comprising applying an ultraviolet light source to the adhesive layer.

19. The method as claimed in claim 1, wherein the first substrate has a plurality of electronic devices thereon.

20. The method as claimed in claim 19, further comprising providing a mask disposed between the electromagnetic wave light source and the second substrate, so that the gas barrier is patterned and transferred to the electronic devices, covering the plurality of electronic devices.

21. The method as claimed in claim 20, wherein the mask comprises one or more than one layer of mask.

22. The method as claimed in claim 1, wherein the forming of the gas barrier comprises a plasma enhanced chemical vapor deposition process.

23. The method as claimed in claim 1, wherein the second substrate comprises a glass or a flexible substrate.

24. The method as claimed in claim 1, wherein the process temperature of forming the gas barrier is between a room temperature to 1000° C.

25. The method as claimed in claim 1, wherein the electronic device comprises an organic light emitting diode, an organic thin film transistor or an organic thin film solar cell.

* * * * *